(12) United States Patent
Zheng et al.

(10) Patent No.: US 9,472,587 B2
(45) Date of Patent: Oct. 18, 2016

(54) STORAGE TRANSISTOR WITH OPTICAL ISOLATION

(71) Applicant: OMNIVISION TECHNOLOGIES, INC., Santa Clara, CA (US)

(72) Inventors: Yuanwei Zheng, San Jose, CA (US); Xianmin Yi, Menlo Park, CA (US); Gang Chen, San Jose, CA (US); Duli Mao, Sunnyvale, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 113 days.

(21) Appl. No.: 14/606,416

(22) Filed: Jan. 27, 2015

(65) Prior Publication Data

US 2016/0218132 A1 Jul. 28, 2016

(51) Int. Cl.
*H01L 27/14* (2006.01)
*H01L 27/146* (2006.01)

(52) U.S. Cl.
CPC ... *H01L 27/14623* (2013.01); *H01L 27/14612* (2013.01); *H01L 27/14643* (2013.01)

(58) Field of Classification Search
CPC .................. H01L 27/14623; H01L 27/14643; H01L 27/14612
See application file for complete search history.

(56) References Cited

U.S. PATENT DOCUMENTS 8,773,562 B1 * 7/2014 Fan .................... H01L 27/14643
 250/208.1
8,964,081 B2 * 2/2015 Ohkubo ............ H01L 27/14623
 250/208.1

OTHER PUBLICATIONS

Velichko, S. et al., "Low Noise High Efficiency 3.75 µm and 2.8 µm Global Shutter CMOS Pixel Arrays," 2013 International Image Sensor Workshop, Jun. 2013, Snowbird, Utah, 2013 Aptina Imaging Corporation (4 pages).

* cited by examiner

*Primary Examiner* — Tony Ko
(74) *Attorney, Agent, or Firm* — Blakely Sokoloff Taylor & Zafman LLP

(57) ABSTRACT

A storage transistor with a storage region is disposed in a semiconductor material. A gate electrode is disposed in a bottom side of an interlayer proximate to the storage region, and a dielectric layer is disposed between the storage region and the gate electrode. An optical isolation structure is disposed in the interlayer and the optical isolation structure extends from a top side of the interlayer to the gate electrode. The optical isolation structure is also adjoining a perimeter of the gate electrode and contacts the gate electrode. A capping layer is disposed proximate to the top side of the interlayer and the capping layer caps a volume encircled by the optical isolation structure.

20 Claims, 3 Drawing Sheets

STORAGE TRANSISTOR WITH OPTICAL ISOLATION

BACKGROUND INFORMATION

1. Field of the Disclosure

The present invention relates generally to semiconductor devices. More specifically, examples of the present invention are related to image sensor pixel cells having global shutters.

2. Background

For high-speed image sensors, a global shutter can be used to capture fast-moving objects. A global shutter typically enables all pixel cells in the image sensor to simultaneously capture the image. For slower moving objects, the more common rolling shutter is used. A rolling shutter normally captures the image in a sequence. For example, each row within a two-dimensional ("2D") pixel cell array may be enabled sequentially, such that each pixel cell within a single row captures the image at the same time, but each row is enabled in a rolling sequence. As such, each row of pixel cells captures the image during a different image acquisition window. For slow moving objects, the time differential between each row can generate image distortion. For fast-moving objects, a rolling shutter can cause a perceptible elongation distortion along the object's axis of movement.

To implement a global shutter, storage capacitors or storage transistors can be used to temporarily store the image charge acquired by each pixel cell in the array while it awaits readout from the pixel cell array. When a global shutter is used, a transfer transistor is typically used to transfer image charge from the photodiode to the storage transistor, and then an output transistor is used to transfer the stored image charge from the storage transistor to a readout node of the pixel cell. Factors that affect performance in an image sensor pixel cell having a global shutter include global shutter efficiency, dark current, white pixels, and image lag. In general, global shutter pixel performance improves as global shutter efficiency improves. Global shutter efficiency is a measure of how well signal charge can be stored in the storage node without being contaminated by parasitic light and/or electrical crosstalk.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to storage transistors with optical isolation are disclosed. In the following description, numerous specific details are set forth in order to provide a thorough understanding of the present invention. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples.

As will be shown, a global shutter pixel cell including a storage transistor surrounded by an optical isolation structure and capping layer is disclosed. The optical isolation structure and capping layer isolate the storage transistor from parasitic incident light entering the storage transistor. The absorption of incident light by the storage transistor degrades image quality, as unwanted hole-electron pairs pollute the image charge stored in the storage transistor. Thus, through the addition of the optical isolation structure, global shutter efficiency is improved because image charge stored in the storage transistor remains uncontaminated by unwanted photons.

Figure 1A:
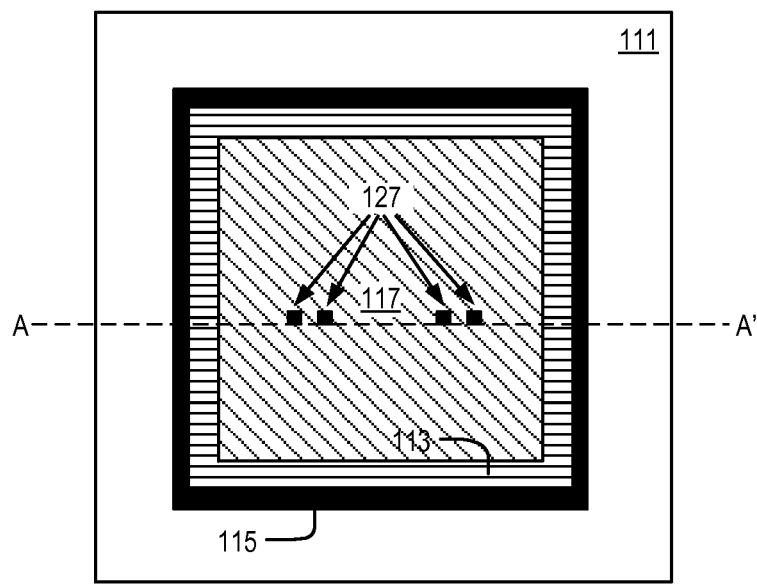
FIG. 1A is a schematic illustrating one example of a top-down view of a storage transistor, in accordance with the teachings of the present invention.

FIG. 1A is a schematic illustrating one example of a top-down view of a storage transistor 101. Included are interlayer 111, capping layer 117, and optical isolation structure 113. In the depicted example, optical isolation structure 113 encircles the perimeter of the gate electrode (e.g. gate electrode 109). Liner layer 115 is disposed between interlayer 111 and optical isolation structure 113. Further, electrical contacts 127 are depicted as connected to capping layer 117. In one example, capping layer 117 and electrical contacts 127 may include metal.

Figure 1B:
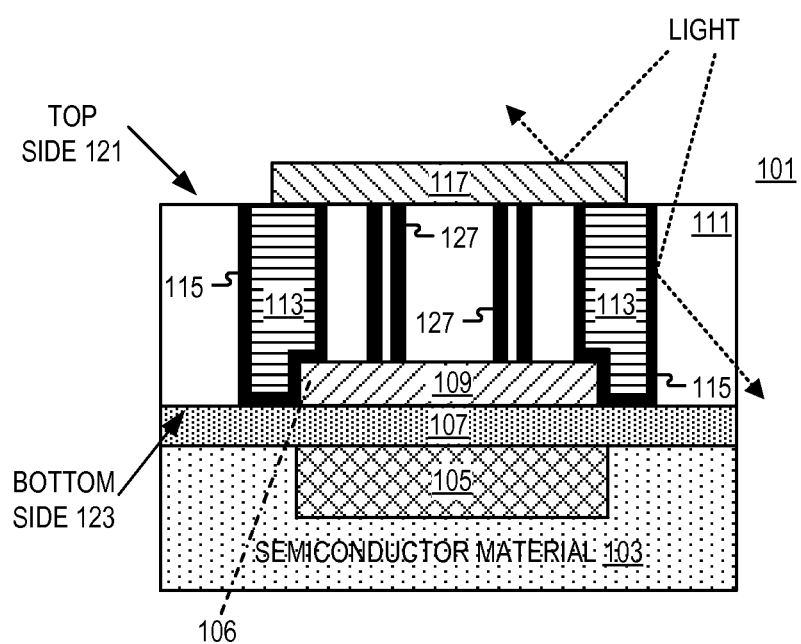
FIG. 1B is a cross-sectional view illustrating the example storage transistor in FIG. 1A as cut along line A-A' in accordance with the teachings of the present invention.

FIG. 1B is a cross-sectional view illustrating example storage transistor 101 in FIG. 1A as cut along line A-A'. In one example, storage transistor 101 includes storage region 105 disposed in semiconductor material 103, gate electrode 109 disposed in the bottom side 123 of interlayer 111, dielectric layer 107 disposed between storage region 105 and gate electrode 109, optical isolation structure 113 disposed in interlayer 111, and capping layer 117 disposed proximate to the top side 121 of interlayer 111. In the depicted example, optical isolation structure 113 extends from the top side 121 of interlayer 111 to gate electrode 109, and optical isolation structure 113 is adjoining a perimeter of gate electrode 109 and contacts gate electrode 109. Additionally, capping layer 117 caps a volume encircled by optical isolation structure 113. In one example, optical isolation structure 113 is electrically coupled to gate electrode 109, and optical isolation structure 113 is electrically coupled to capping layer 117. In another or the same example, capping layer 117 is electrically coupled to gate electrode 109 via electrical contacts 127.

In one example, optical isolation layer 113 and capping layer 117 shield gate electrode 109 and prevent incident light from reaching—and being absorbed by—storage transistor 101. As shown in the example depicted in FIG. 1B, incident light on optical isolation structure 113 is reflected rather than traveling to storage transistor 101, in accordance with the teachings of the present invention. If incident light were to reach storage transistor 101, it could be absorbed by semiconductor material 103 resulting in the formation of hole-electron pairs. These hole-electron pairs could alter image charge saved in storage transistor 101 resulting in images with increased noise or other forms of electronic degradation.

In one example, optical isolation structure 113 comprises tungsten. However, in another or the same example, optical isolation structure 113 may include other metals, and/or binary/ternary alloys. Further, liner layer 115 may be disposed between interlayer 111 and optical isolation structure 113. Liner layer 115 may include titanium, nitrogen, and/or an alloy of the two. However, liner layer 115 may also be comprised of other metals and/or binary/ternary alloys.

In one example, optical isolation structure 113 is formed after storage region 105, dielectric layer 107, and gate electrode 109 have all been formed in/on semiconductor material 103. Once the aforementioned layers of device architecture are in place, interlayer 111 is deposited. Following deposition of interlayer 111, interlayer 111 is etched (wet or dry) to produce a trench encircling and contacting gate electrode 109. The trench is then lined with liner layer 115. In one example, liner layer 115 is deposited via thermal evaporation, chemical vapor deposition, or atomic layer deposition. After deposition of the liner layer 115, optical isolation structure 113 may be formed by depositing a material such as tungsten in the trench so that liner layer 115 is disposed between optical isolation structure 113 and interlayer 111. In another example, other oxides, semiconductors, and/or metals may be used to form optical isolation structure 113. Excess optical isolation structure 113 may be removed from the font side 121 of interlayer 111 via chemical mechanical polishing. Once the surface of interlayer 111 is free of excess optical isolation structure 113, capping layer 117 may be deposited.

It should be appreciated that storage transistor 101 may include other elements not depicted in FIG. 1A and FIG. 1B. In one example, storage transistor 101 may also include one or more additional isolation structures disposed in semiconductor material 103 to isolate storage region 105 from electronic interference and prevent incident light from reaching storage region 105. These isolation structures may be disposed in semiconductor material 103 proximate to storage transistor 101 to isolate a sidewall of storage region 105 from parasitic incident light and/or stray charge in semiconductor material 103. In another or the same example, an optional spacer region 106 may be disposed between gate electrode 109 and optical isolation structure 113. Spacer region 106 may be comprised of an insulator such as a semiconductor oxide, semiconductor nitride, metal oxide, or the like. In one example, spacer region 106 may be silicon nitride. In another example, spacer region 106 may be silicon oxide.

Figure 2:
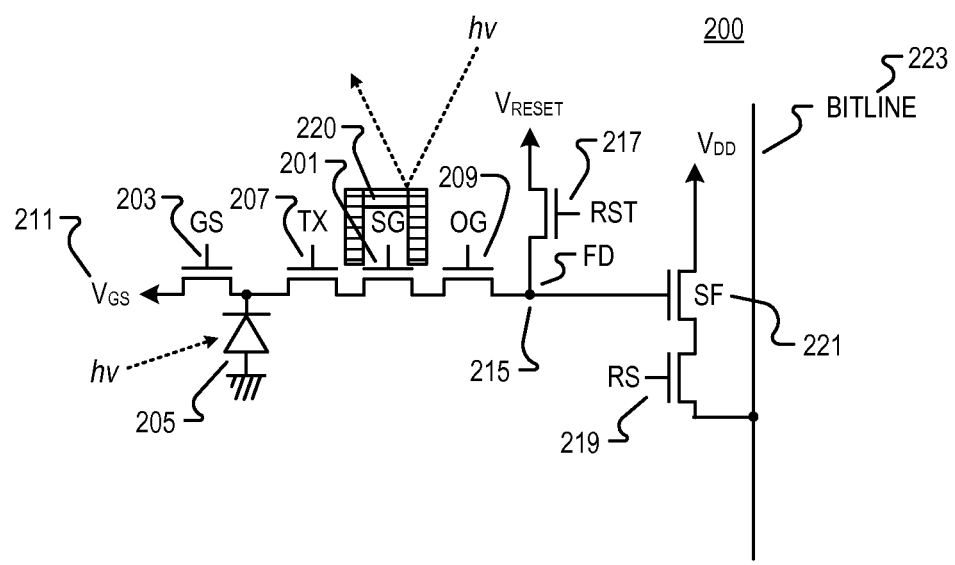
FIG. 2 is a schematic illustrating one example of a pixel cell including a storage transistor in accordance with the teachings of the present invention.

FIG. 2 is a schematic illustrating one example of pixel cell 200 including storage transistor 201. As shown in the depicted example, pixel cell 200 also includes global shutter transistor 203, photodiode 205, transfer transistor 207, output transistor 209, a floating diffusion 215, a reset transistor 217, an amplifier transistor 221, and a row select transistor 219 coupled to a bitline 223. In one example, amplifier transistor 221 is implemented with a source follower coupled transistor. As shown in the depicted example, global shutter transistor 203 is coupled between a $V_{GS}$ voltage and photodiode 205.

In operation, image charge is accumulated in photodiode 205 when incident light enters photodiode 205 and is converted into hole-electron pairs. Global shutter transistor 203 is coupled to selectively deplete the image charge that has accumulated in photodiode 205 by selectively coupling photodiode 205 to voltage VGS in response to a global shutter signal GS. Alternatively, image charge accumulated in photodiode 205 may be transferred to storage transistor 201 through transfer transistor 207 to be readout as image data. Transfer transistor 207 may be coupled between photodiode 205 and storage transistor 201 to selectively transfer the image charge from photodiode 205 to storage transistor 201.

In the depicted example, storage transistor 201 is illustrated as being isolated with an optical isolation structure 220. In one example, optical isolation structure 220 helps to prevent incident light from reaching storage transistor 201, in accordance with the teachings of the present invention.

The example in FIG. 2 also illustrates that output transistor 209 is coupled to an output of storage transistor 201 to selectively transfer the image charge from storage transistor 201 to floating diffusion 215. A reset transistor 217 is coupled between a reset voltage VRESET and floating diffusion 215 to selectively reset the charge in floating diffusion 215 in response to a reset signal RST. In the depicted example, amplifier transistor 221 includes an amplifier gate coupled to floating diffusion 215 to amplify the signal on floating diffusion 215 to output image data from pixel cell 200. Row select transistor 219 is coupled between bitline 223 and amplifier transistor 221 to output the image data to bitline 223.

In one example, a plurality of photodiodes may share the same floating diffusion. In this example, each photodiode may have its own shutter transistor, transfer transistor, and output transistor. Charge may be transferred from the plurality of photodiodes to their respective storage transistor in series or simultaneously by applying a voltage to the gate of each transfer transistor. Similarly, charge may be transferred from individual storage transistors to the shared floating diffusion in series or simulaniously by applying a voltage to the gate of each output transistor.

Figure 3:
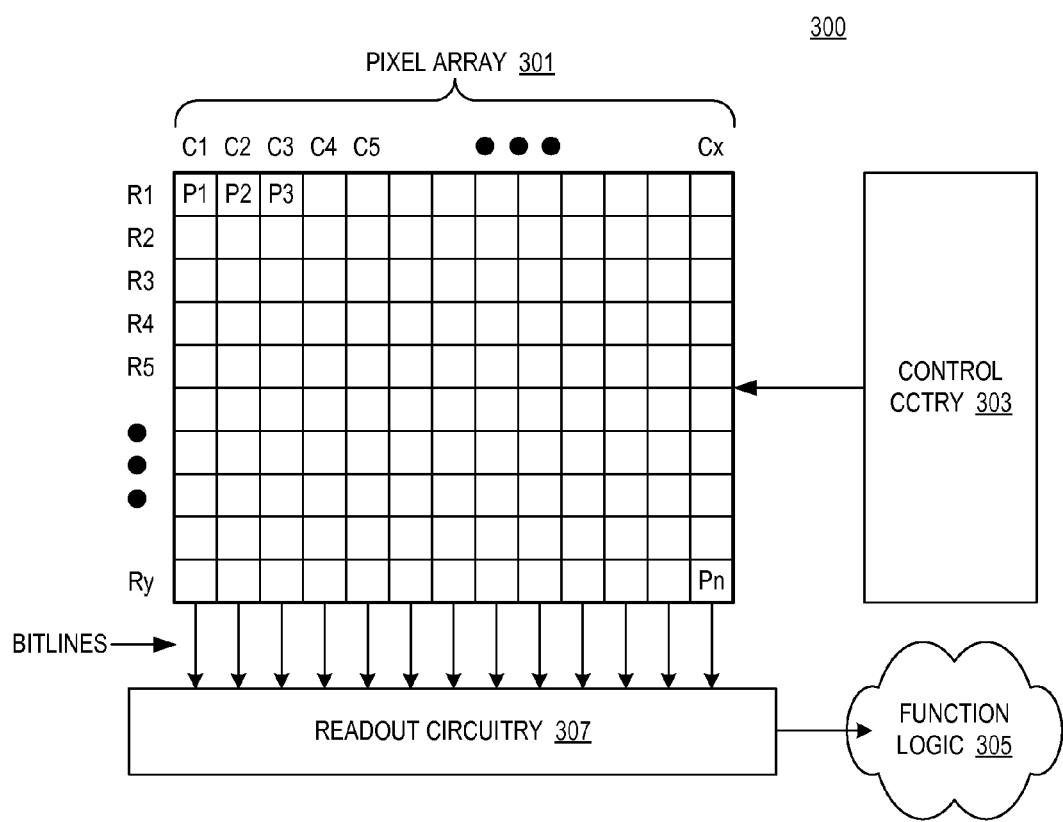
FIG. 3 is a diagram illustrating one example of an imaging system including a pixel array having pixel cells including a storage transistor in accordance with the teachings of the present invention.

FIG. 3 is a diagram illustrating one example of an imaging system 300 including pixel array 301 having pixel cells (e.g. pixel cell 200) including a storage transistor. In pixel array 301, each pixel in pixel array 301 (e.g. pixels P1, P2 Pn) includes a photodiode (e.g. photodiode 205) disposed in a semiconductor material (e.g. semiconductor material 103) and a storage transistor (e.g. storage transistor 201) coupled to receive the image charge from the photodiode. As shown in the depicted example, image sensor 300 may also include readout circuitry 307, function logic 305, and control circuitry 303. In one example, pixel array 301 is a two-dimensional (2D) array of individual pixels (e.g. pixels P1, P2 Pn) including rows (e.g. rows R1 to Ry.) and columns (e.g. column C1 to Cx). In one example, it is appreciated that the pixels P1, P2, Pn may be examples of individual pixel cells (e.g. pixel cell 200) as discussed in FIG. 2. Pixel array 301 may be used to acquire image data of a person, place, object, etc., which can then be used to render a 2D image of the person, place, object, etc. In one example, after each image sensor pixel in pixel array 301 has acquired its image data or image charge, image charge is then readout by readout circuitry 307 and transferred to function logic 305. In one example, readout circuitry 307 is coupled to readout the image charge from a floating diffusion (e.g. floating diffusion 215) and function logic 305 is coupled to readout circuitry 307 to perform logic operations on the image charge.

In various examples, readout circuitry 307 may include amplification circuitry, analog-to-digital (ADC) conversion circuitry, or otherwise. Function logic 305 may simply store the image data or even manipulate the image data by applying post image effects (e.g. crop, rotate, remove red eye, adjust brightness, adjust contrast, or otherwise). In one example, readout circuitry 307 may readout a row of image data at a time along readout column lines (illustrated) or may readout the image data using a variety of other techniques (not illustrated), such as a serial readout or a full parallel readout of all pixels simultaneously.

In one example, control circuitry 303 is coupled to control operation of the pixels (e.g. P1, P2, P3, etc.) in pixel array 301. For example, control circuitry 303 may generate a shutter signal for controlling image acquisition. In one example, the shutter signal is a global shutter signal for simultaneously enabling all pixels within pixel array 301 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 300 may be included in a digital camera, cell phone, laptop computer, or the like. Additionally, imaging system 300 may be coupled to other elements of hardware such as a processor, memory elements, output (USB port, wireless transmitter, HDMI port, etc.), lighting/flash, electrical input (keyboard, touch display, track pad, mouse, microphone, etc.), and/or display. Other elements of hardware may deliver instructions to imaging system 300, extract image data from imaging system 300, or manipulate image data supplied by imaging system 300.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example structures, materials, use-cases etc., are provided for explanation purposes and that substitutes may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A storage transistor, comprising:
   a storage region disposed in a semiconductor material;
   a gate electrode disposed in a bottom side of an interlayer proximate to the storage region;
   a dielectric layer disposed between the storage region and the gate electrode;
   an optical isolation structure disposed in the interlayer, wherein the optical isolation structure extends from a top side of the interlayer to the gate electrode, and wherein the optical isolation structure is adjoining a perimeter of the gate electrode and contacts the gate electrode; and
   a capping layer disposed proximate to the top side of the interlayer, wherein the capping layer caps a volume encircled by the optical isolation structure.

2. The storage transistor of claim 1 wherein the optical isolation structure is electrically coupled to the gate electrode, and wherein the optical isolation structure is electrically coupled to the capping layer.

3. The storage transistor of claim 1 wherein the capping layer is electrically coupled to the gate electrode via electrical contacts.

4. The storage transistor of claim 1 wherein the optical isolation structure comprises tungsten.

5. The storage transistor of claim 1 further comprising a liner layer disposed between the interlayer and the optical isolation structure.

6. The storage transistor of claim 5 wherein the liner layer includes titanium.

7. The storage transistor of claim 5 wherein the liner layer includes metal nitride.

8. A storage transistor, comprising:
   a storage region disposed in a semiconductor material;
   a dielectric layer disposed on the semiconductor material;
   a gate electrode disposed proximate to the storage region, wherein the dielectric layer is disposed between the semiconductor material and the gate electrode;
   an interlayer disposed on the gate electrode, wherein the gate electrode is disposed between the dielectric layer and the interlayer;
   an optical isolation structure disposed in the interlayer and adjoining a perimeter of the gate electrode; and
   a capping layer disposed in the interlayer in contact with the optical isolation structure to prevent incident light from reaching the storage region.

9. The storage transistor of claim 8 wherein the optical isolation structure is electrically coupled to the gate electrode, and wherein the optical isolation structure is electrically coupled to the capping layer.

10. The storage transistor of claim 8 wherein the capping layer is electrically coupled to the gate electrode via electrical contacts.

11. The storage transistor of claim 8 wherein the capping layer comprises metal.

12. The storage transistor of claim 8 wherein the optical isolation structure and the capping layer shield the gate electrode and prevent the incident light from reaching the storage region.

13. The storage transistor of claim 8 wherein the interlayer is disposed between the gate electrode and the capping layer.

14. An imaging system comprising:
a pixel array, wherein each pixel in the pixel array includes:
a photodiode disposed in a semiconductor material to accumulate image charge in response to incident light directed to the photodiode; and
a storage transistor coupled to receive the image charge from the photodiode, wherein the storage transistor includes:
   a storage region disposed in the semiconductor material;
   a gate electrode disposed in a bottom side of an interlayer proximate to the storage region;
   a dielectric layer disposed between the storage region and the gate electrode;
   an optical isolation structure disposed in the interlayer, wherein the optical isolation structure extends from a top side of the interlayer to the gate electrode, and wherein the optical isolation structure is adjoining a perimeter of the gate electrode; and
   a capping layer disposed proximate to the top side of the interlayer, wherein the capping layer caps a volume enclosed by the optical isolation structure.

15. The imaging system of claim 14 further comprising a transfer transistor coupled between the photodiode and the storage transistor to selectively transfer the image charge from the photodiode to the storage transistor.

16. The imaging system of claim 14 further comprising a global shutter transistor coupled to selectively deplete the image charge from the photodiode.

17. The imaging system of claim 14 further comprising an output transistor coupled to the storage transistor to selectively transfer the image charge from the storage transistor to a floating diffusion.

18. The imaging system of claim 17 further comprising:
readout circuitry coupled to readout the image charge from the floating diffusion; and
function logic coupled to the readout circuitry to perform logic operations on the image charge.

19. The imaging system of claim 14 further comprising control circuitry to control operation of the pixels in the pixel array.

20. The imaging system of claim 14 further comprising a spacer region disposed between the gate electrode and the optical isolation structure.

* * * * *